United States Patent
Donetsky

(10) Patent No.: US 7,819,682 B2
(45) Date of Patent: Oct. 26, 2010

(54) PLUG-AND-SOCKET CONNECTOR ASSEMBLY

(76) Inventor: Yurij Donetsky, Mikrorayon Dzerzhinskogo 33-70, Balashikha, Moscow Region (RU) 143913

(*) Notice: Subject to any disclaimer, the term of this patent is extended or adjusted under 35 U.S.C. 154(b) by 0 days.

(21) Appl. No.: 12/450,365

(22) PCT Filed: Jul. 10, 2008

(86) PCT No.: PCT/RU2008/000452

§ 371 (c)(1),
(2), (4) Date: Sep. 22, 2009

(87) PCT Pub. No.: WO2009/031929

PCT Pub. Date: Mar. 12, 2009

(65) Prior Publication Data

US 2010/0136843 A1    Jun. 3, 2010

(30) Foreign Application Priority Data

Aug. 17, 2007   (RU) ............................... 2007131370

(51) Int. Cl.
*H01R 13/62* (2006.01)
(52) U.S. Cl. ..................................................... 439/263
(58) Field of Classification Search ................ 439/263, 439/259, 265, 268, 296, 342
See application file for complete search history.

(56) References Cited

U.S. PATENT DOCUMENTS

| | | | | |
|---|---|---|---|---|
| 4,815,987 A | * | 3/1989 | Kawano et al. | 439/263 |
| 5,017,152 A | * | 5/1991 | Matsuoka | 439/263 |
| 5,454,727 A | * | 10/1995 | Hsu | 439/263 |
| 5,721,673 A | | 2/1998 | Klein | |
| 6,164,999 A | * | 12/2000 | McCutchan et al. | 439/342 |
| 6,960,092 B1 | * | 11/2005 | Hussain et al. | 439/263 |
| 7,214,082 B2 | * | 5/2007 | Hashiguchi et al. | 439/263 |
| 2010/0092134 A1 | * | 4/2010 | Donetsky et al. | 385/59 |

FOREIGN PATENT DOCUMENTS

| | | |
|---|---|---|
| RU | 2266593 | 12/2005 |
| RU | 2295182 | 3/2007 |
| SU | 1737583 | 5/1992 |

* cited by examiner

*Primary Examiner*—Chandrika Prasad
(74) *Attorney, Agent, or Firm*—Aleksandr Smushkovich

(57) ABSTRACT

The proposed plug-and-socket connector assembly comprises a male plug with contact pins and a female receptacle with contact sockets. The receptacle comprises a slider, opening the sockets to pass the pins and closing them by tight clamping, an arm displacing the slider, a lock holding the slider so that the pins freely penetrate into the sockets, and a lock releasing button. Optionally, the arm can be substituted by a knob, shifting the slider on guides. The slider is designed as a frame with a grid of plates passing through rows of the sockets shaped as clamps having embracing portions for tightly gripping the pins. The first sockets' ends are fixed in the receptacle, the second ends thereof are movable, varying the embracing portions. The proposed assembly improves contact, simplifies the design of such devices, and reduces their size.

1 Claim, 5 Drawing Sheets

PLUG-AND-SOCKET CONNECTOR ASSEMBLY

CROSS-REFERENCES TO RELATED APPLICATIONS

This application is a U.S. national phase application of a PCT application PCT/RU2008/000452 filed on 10 Jul. 2008, published as WO2009/031929, whose disclosure is incorporated herein in its entirety by reference, which PCT application claims priority of a Russian Federation patent application RU2007131370 filed on 17 Aug. 2007.

FIELD OF THE INVENTION

This invention belongs to the field of electrical engineering and electronics. It can be used to connect power supply to electric and electronic devices and to switch electric and electronic circuits, which require connectors that are easy to connect or disconnect.

BACKGROUND OF THE INVENTION

Plug and socket connectors are widely used in electronics and electrical engineering. As a rule, they consist of a male plug with contact pins and a plug receptacle with female contact sockets. The socket and pins are made of an elastic electro-conducting material. This material is shaped so that it will be elastically deformed when the male plug is inserted into the plug receptacle. This ensures the compression required for proper contact. This is why a plug and socket connector can be connected or disconnected with an effort. This makes it difficult to determine whether or not the male plug is properly aligned with the plug receptacle. Contact pins are often subject to non-elastic deformation. This causes the plug connector to fail.

Additional structural elements are used to ensure more reliable electrical contact and more reliable locking the male plug connection. They align and compress the matching contacts or couple contact housings. Notably, such compression results from additional operations (assembling together the contact housing, shifting or turning compressive elements, etc.). Before the contacts can be disconnected, one also needs to perform an operation to release the contacts or separate their housings.

Prior art discloses a ZIF connector (Zero Insertion Force) for a processor (U.S. Pat. No. 6,164,999), comprising a matrix of contact sockets on a PC motherboard circuit, a movable platform with openings for contact pins of the processor, and an arm for shifting the platform relative to the matrix of contact sockets. To mount the processor into the socket, the arm has to be lifted perpendicularly to the motherboard. In this case the openings of the movable platform are aligned with the contact sockets. The processor contact pins freely pass through the openings of the movable platform and are inserted into contact sockets. This reduces the risk of damage to contact elements.

Then the arm is lowered toward the motherboard and placed behind a tongue on the socket frame, locking the processor in the socket. The movable platform shifts the processor contact pins in a transverse direction relative to the contact sockets, pressing them to the walls of contact sockets with the force of the locked arm.

In such a connector the reliability of each contact depends on the precision of manufacturing and installation of the matrix of contact sockets on the mother board and the matrix of contact pins on the processor. To rule out the effect of installation imprecision, the compression force created by the arm is increased. This in turn increases the labor intensity of production and installation and the cost of the processor and motherboard. There is a high risk of processor misalignment and incorrect locking, since the force that presses the contact pins to the contact sockets considerably exceeds the required force. Misalignment may result in damage to the processor contact pins.

Prior art discloses another plug and socket connector (Patent RU 2 295 182 C 1) that has been chosen as a prototype (the nearest prior art device) for this invention. It comprises a male plug and a socket (plug receptacle). The plug receptacle is equipped with a lock. It can retain a slider in a position wherein contact pins or plates of the male plug can freely enter the contact sockets. There is a lock release button in the middle of contact sockets at the point where contact pins of the male plug enter the plug receptacle. It releases the lock when pressed by the body of the male plug inserted into the plug receptacle. Contact sockets are made in the shape of clamps of a curved resilient material. At the base of the contact sockets there are pads, being either in contact with one another or at a distance that is smaller than the thickness of the contact pins or plates. There are tongues at one of the ends. The tongues are located in hollows in the slider. The tongues can shift the slider and compress the contact pins or plates when the lock is opened.

This plug-and-socket connector is convenient to use. Its electrical contacts are connected with a single effortless move. All contact pins are embedded into contact sockets to a requisite depth. Proper compression force between the pin and the contact socket is created. With a single press of the arm, the electrical contacts are disconnected and the male plug is removed from the plug receptacle. The force of compression between contacts in each contact socket depends on the elasticity of this socket and does not depend on the precision of installation of the matrix of contact sockets and the matrix of contact pins or plates. Still, this design also has its shortcomings. The area of reliable contact between the pin and contact socket is small, since the compression force is applied only by pads at the end of contact sockets. The male plug pins have to be quite long, since the slider does not allow the contact pins to be inserted into the plug receptacle contact sockets all the way through. This results in an increased connector height, which is not always convenient and technologically feasible.

BRIEF DESCRIPTION OF THE INVENTION

The present invention is intended to provide the following technical result: an improved contact, simplified design, and smaller size of the inventive plug-and-socket assembly, including a male plug having contact pins or plates, and a female receptacle having a plurality of contact sockets arranged in rows.

The technical result is achieved by:
equipping the female receptacle with:

a) a slider that can move in a transverse direction relative to the contact sockets;

b) an arm or button for displacing the slider;

c) a lock that can retain the slider in a position wherein the contact pins or plates of the male plug can freely enter the contact sockets;

d) a lock release button in the middle of contact sockets at the point where the contact pins of the male plug enter the receptacle; and also providing the following:

e) the slider is made in the form of a frame with a grating of plates extended between the rows of contact sockets;

f) the contact sockets are made in the form of clamps of an elastic material and shaped so that they can tightly grip the contact pins or plates;

g) one of the clamp ends is fixed in an immovable part of the receptacle; the other end is movable; such movement increases the passage between the clamping parts of the contact socket so that the contact pins or plates can easily enter the socket, or reduces it to a size where they tightly grip the contact pins or plates;

h) there are tongues at the other end of the clamp; and i) the plates of the slider have grooves for these tongues, so that when the lock is opened, the tongues can shift the slider, which enables the contact sockets to grip the contact pins or plates.

DETAIL DESCRIPTION OF A PREFERRED EMBODIMENT

Figure 1:
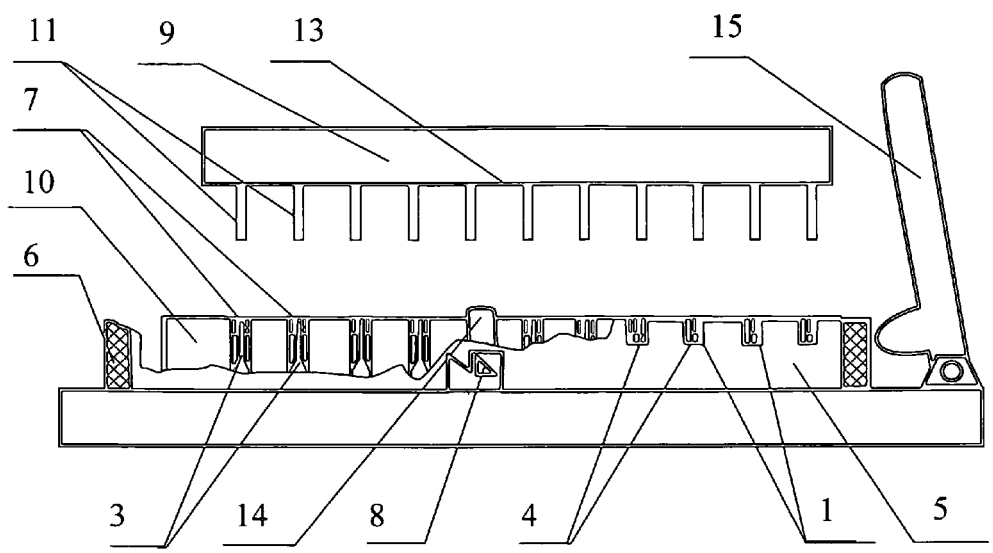
FIG. 1 shows a side view of an electrical plug-and-socket connector assembly in a disconnected state, with a slot in the side of the slider plate containing the lock, according to an embodiment of the present invention.

While the invention may be susceptible to embodiment in different forms, there is shown in the drawings, and will be described in detail herein, a specific embodiment of the present invention, with the understanding that the present disclosure is to be considered an exemplification of the principles of the invention, and is not intended to limit the invention to that as illustrated and described herein.

FIGS. 1, 2, 3, and 5 illustrate a preferred embodiment of the inventive plug-and-socket connector assembly, which comprises: a male plug (9) having a frontal panel (13) and a plurality of contact pins (11) fixed in the plug (9) and protruding from the panel (13); and a female receptacle (10) that includes an immovable base, an open-position lock (8) fixed to the immovable base and mounted essentially in the middle of receptacle (10), the lock (8) is furnished with a lock release button (14) capable of opening the lock (8). The receptacle (10) includes a slider (6) including a frame movable with respect to the immovable base, and an arm (15) capable of displacing the slider (6) relatively to the immovable base.

The slider (6) comprises a plurality of elongated solid plates (5) mounted to the frame in parallel to each other. The receptacle (10) includes a plurality of contact sockets (3) arranged along and between the plates (5); the sockets (3) are made in the form of clamps of an elastic electroconductive material. Each plate (5) has a plurality of grooves (4) made therein. Each socket (3) has a first end (2) furnished with a tongue (1) projected into the corresponding groove (4) and a second end (7) fixedly attached to the immovable base of receptacle (10), so that the socket (3) has an embracing portion (12) capable of operatively gripping the pins (11) with a predetermined force.

The plug-and-socket connector assembly operates as follows. In the disconnected state (FIGS. 1, 3, 5), the tongue (1) is located in the groove (4). It is retained by the slider (6) and uses the elastic force of the material of contact sockets (3) to prevent the end (2) with the tongue (1) from approaching the other end (7). The other end is fixed in the immovable base of the receptacle (10). The slider (6) (FIG. 1) is retained by the open position lock (8) due to elastic forces of the contact sockets (3) transmitted via the tongues (1).

Figure 4:
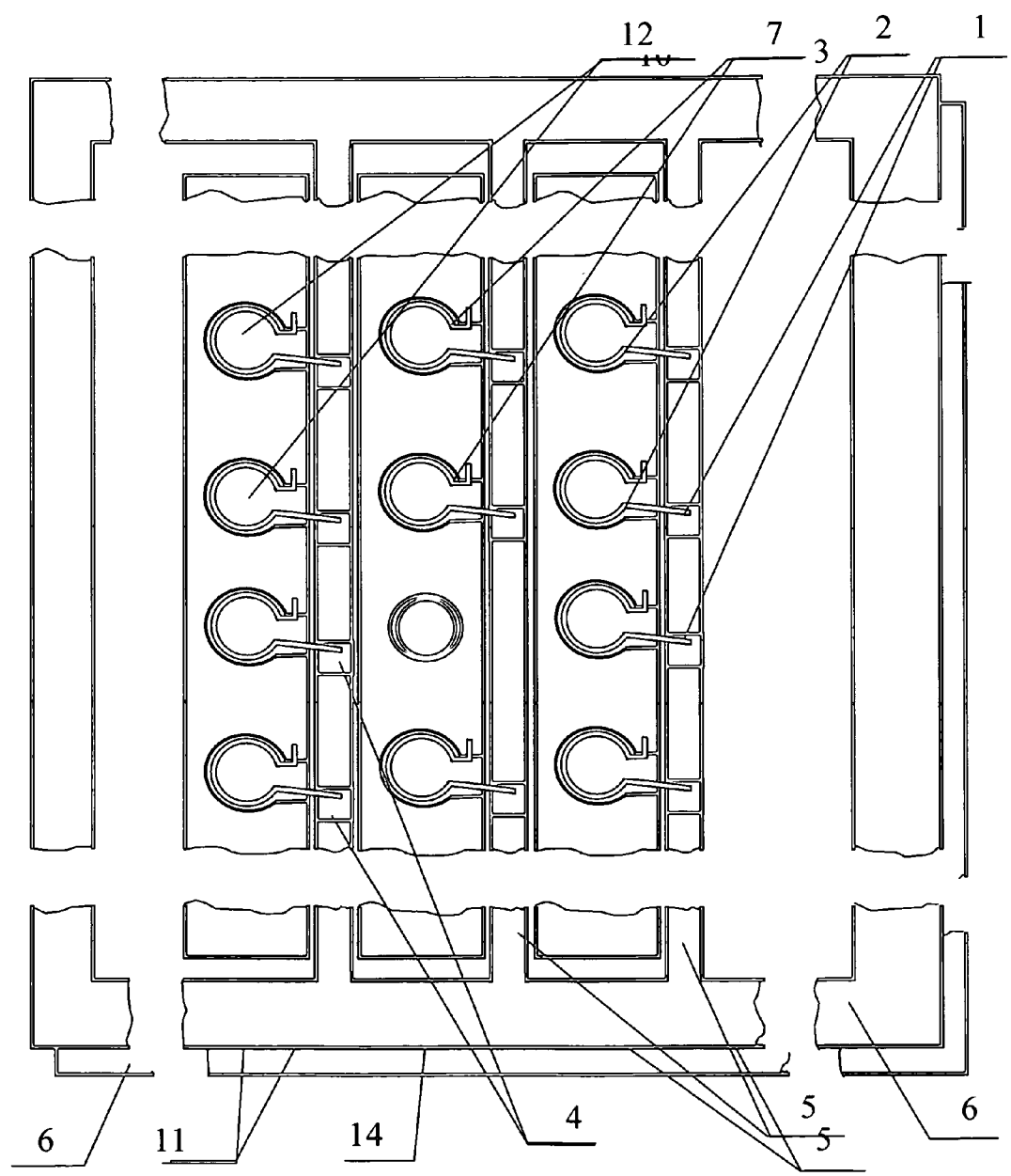
FIG. 4 shows a top view of the plug-and-socket connector assembly in a connected state, according to an embodiment of the present invention.
Figure 6:
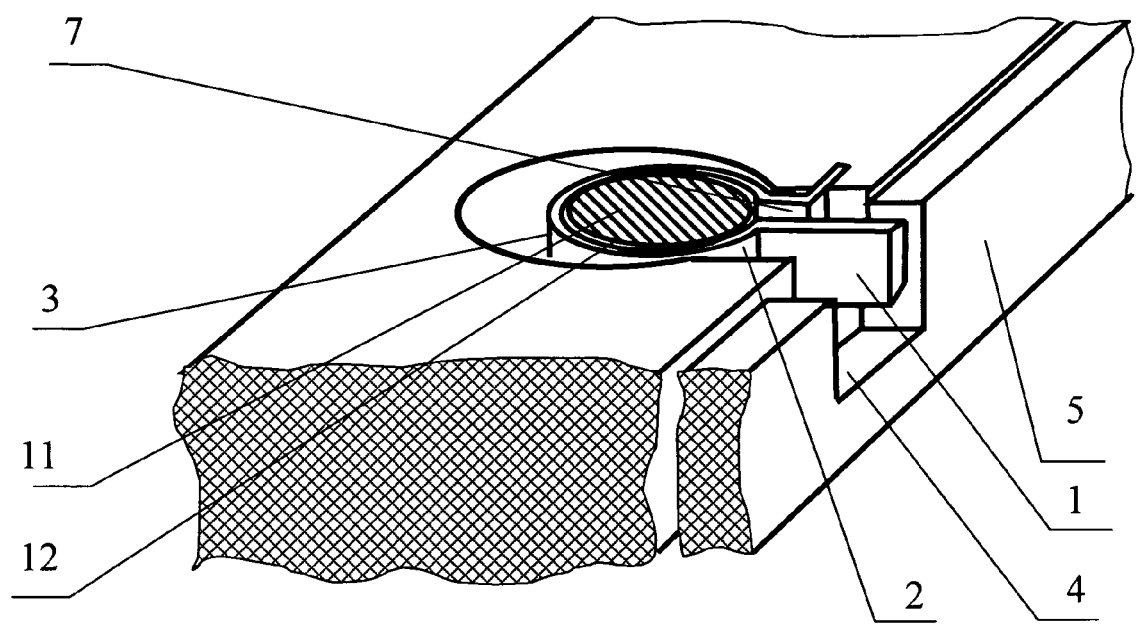
FIG. 6 shows a fragment of the contact socket of the electrical plug and socket connector assembly in a connected state, according to the embodiment shown on FIG. 5.

When the male plug (9) is inserted into the receptacle (10) (FIGS. 2, 4, 6), each of the contact pins (11) enters the contact socket (3), freely passing through the expanded passage of the embracing portion (12). When the contact pins (11) are fully embedded into the contact sockets (3), the male plug (9) with its frontal panel (13) (FIG. 2) presses the button (14) of the lock (8), releasing the slider (6) to move. The movable ends (2) with the tongues (1) (FIG. 6) shift the slider (6) with the plates (5) between the rows of contact sockets (3) (FIG. 4). The tongues (1) are shifted to the end of the contact socket (7) fixed in the immovable base of the receptacle.

This causes the embracing portions (12) to be reduced to a size that allows them to grip tightly the contact pins (11). A click of the lock (8) indicates that the male plug (9) and the receptacle (10) have been connected correctly. This excludes the possibility of misalignment (all the pins are embedded into the contact sockets to the same depth), since the lock button (14) is located in the middle of the receptacle and the lock (8) is released when the fontal panel (13) in the middle of the male plug (9) depresses the button.

Figure 2:
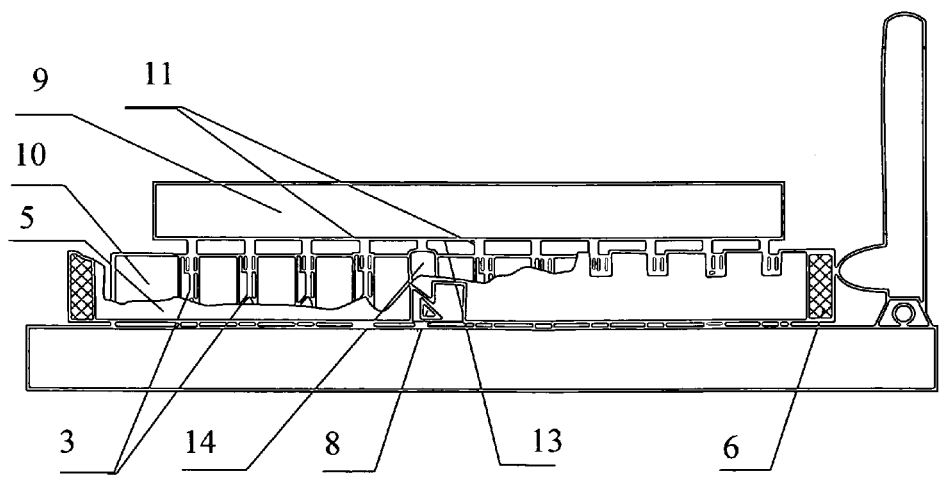
FIG. 2 shows a side view of an electrical plug-and-socket connector assembly in a connected state, with a slot in the side of the slider plate containing the lock, according to the embodiment of the present invention shown on FIG. 1.

In the connected state, all the contact pins (11) (FIGS. 2, 4, 6) are reliably clamped in the contact sockets (3), since the force of compression applied to each contact pin is mainly determined by the elastic properties of the embracing portion (12) and is not essentially dependent on the precision of installation of all the contact elements. The plates (5) are retained by the tongues (1) in a position that does not prevent the contact sockets to establish a reliable contact with the contact pins. The slider (6) retains the lock (8) with the button (14) in the sunken state (FIG. 2).

To extract the male plug (9) from the receptacle (10) (FIG. 2), one should press the arm (15) for displacing the slider (6). An optional knob, shifting the slider on guides, can be used instead of the arm in alternative embodiments (not shown). When turned, the arm (15) moves the slider (6) together with the tongues (1) at the ends of contact sockets (3), releasing the contact pins (11) of the male plug (9).

Figure 3:
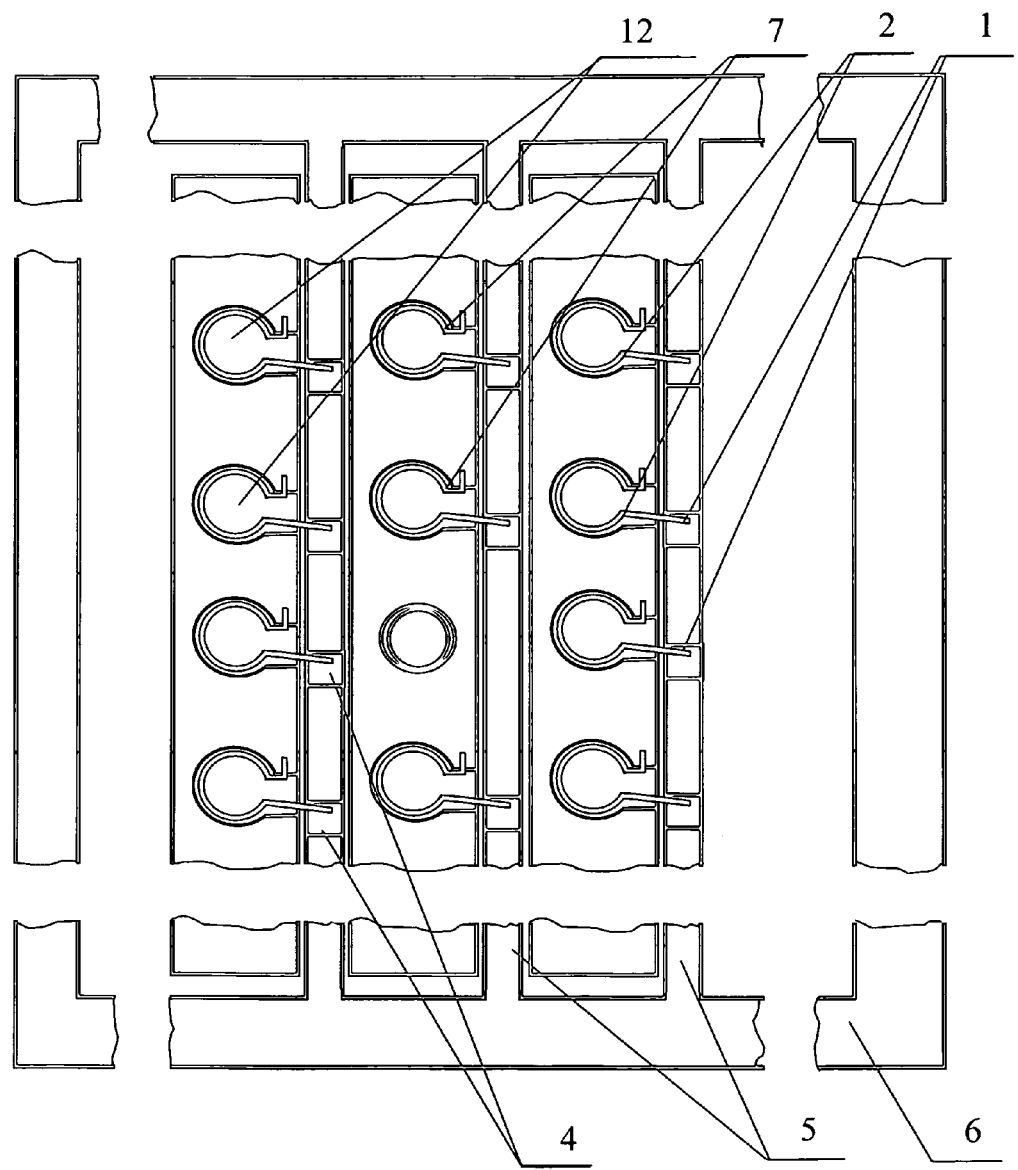
FIG. 3 shows a top view of the plug-and-socket connector assembly in a disconnected state, according to an embodiment of the present invention.
Figure 5:
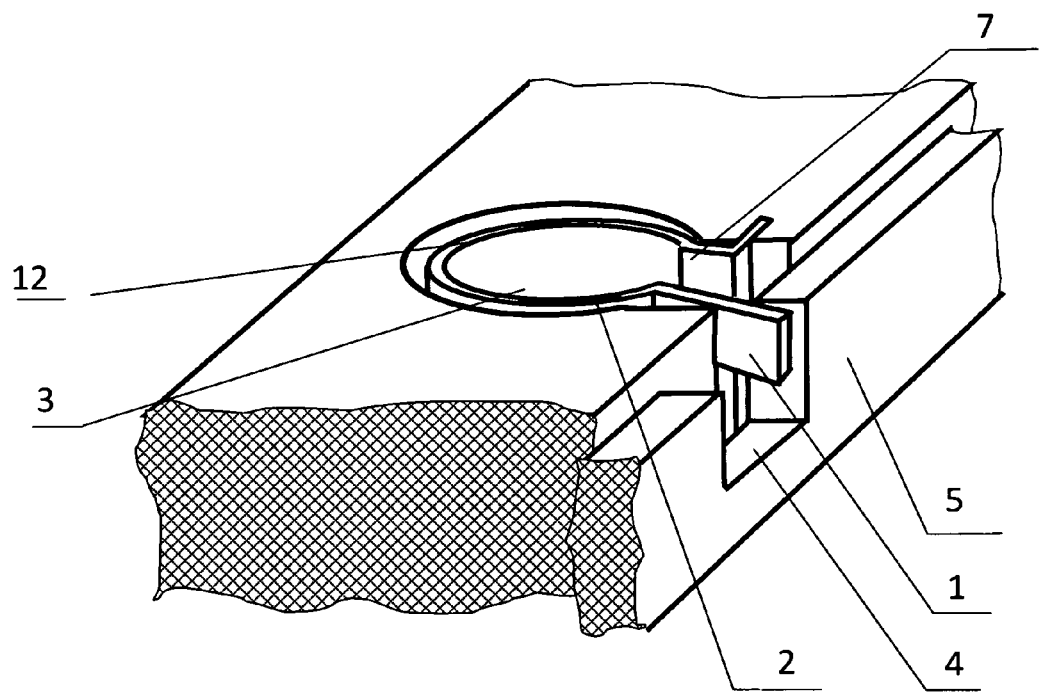
FIG. 5 shows a fragment of the contact socket of the electrical plug and socket connector assembly in a disconnected state, according to an embodiment of the present invention.

After the arm (15) has been released, the slider (6), driven by the elastic forces of contact sockets (3), returns to a position where it is retained by the lock (8) (FIG. 1). In this case, the button (14) rises above the receptacle (10). The plug-and-socket connector assembly returns to its original disconnected state (FIGS. 1, 3, 5).

In this way, the proposed plug-and-socket connector assembly is convenient to use. The electrical contacts are connected and locked with a single effortless move. At this moment all the contact pins are embedded into the contact sockets to a requisite depth. They are gripped with the requisite force. With a single press of the arm, the electrical contacts are disconnected and the male plug is removed from the receptacle. The force of compression between the contacts in each contact socket depends on the elasticity of the embracing portion of this socket and does not depend on the precision of installation of the matrix of contact sockets and the matrix of contact pins or plates. The slider is made in the form of a frame with plates. It does not rise above the contact sockets, which makes the plug-and-socket connector assembly compact and technologically feasible.

The invention claimed is:

1. A plug-and-socket connector assembly comprising:
a male plug including:
   a frontal panel and
   a plurality of contact pins fixed in said plug and protruding from said panel;
and
a female receptacle including:
   a) an immovable base;
   b) an open-position lock fixed to said immovable base and mounted essentially in the middle of said receptacle, said lock is furnished with a lock release button capable of opening said lock;
   c) a slider, including:
      a frame movable with respect to said immovable base, and
      a plurality of elongated solid plates mounted to said frame in parallel to each other, each said plate has a plurality of grooves made therein;
   d) a plurality of contact sockets made in the form of clamps of an elastic electroconductive material and arranged in rows along and between said plates, wherein each said socket has a first end furnished with a tongue projected into the corresponding said groove and a second end fixedly attached to said immovable base so that each said socket has an embracing portion capable of operatively gripping said pins with a predetermined force;
and
   e) an arm capable of displacing said slider relatively to said immovable base.

* * * * *